(12) United States Patent
Okamura

(10) Patent No.: US 7,790,568 B2
(45) Date of Patent: Sep. 7, 2010

(54) METHOD FOR FABRICATING SEMICONDUCTOR DEVICE

(75) Inventor: Tomohiro Okamura, Tokyo (JP)

(73) Assignee: Oki Semiconductor Co., Ltd., Tokyo (JP)

(*) Notice: Subject to any disclaimer, the term of this patent is extended or adjusted under 35 U.S.C. 154(b) by 604 days.

(21) Appl. No.: 11/511,277

(22) Filed: Aug. 29, 2006

(65) Prior Publication Data

US 2008/0057668 A1    Mar. 6, 2008

(51) Int. Cl.
*H01L 21/76* (2006.01)
(52) U.S. Cl. .............. 438/434; 438/405; 438/433; 438/221; 257/E21.149
(58) Field of Classification Search .......... 438/221, 438/404, 405, 433, 434; 257/E21.149
See application file for complete search history.

(56) References Cited

U.S. PATENT DOCUMENTS

| 6,841,400 | B2* | 1/2005 | Matsumoto et al. | 438/7 |
| 2003/0022473 | A1* | 1/2003 | Matsumoto et al. | 438/514 |
| 2006/0024909 | A1* | 2/2006 | Mehrotra et al. | 438/424 |
| 2006/0138484 | A1* | 6/2006 | Han | 257/291 |

FOREIGN PATENT DOCUMENTS

JP        10-093101        4/1998

* cited by examiner

*Primary Examiner*—Zandra Smith
*Assistant Examiner*—Christy L Novacek
(74) *Attorney, Agent, or Firm*—Volentine & Whitt, P.L.L.C.

(57) ABSTRACT

A method for fabricating a semiconductor device includes: providing a semiconductor substrate; forming a STI region on the semiconductor substrate; forming a channel region on the semiconductor substrate; implanting impurities into the STI region; and performing a thermal treatment to diffuse impurities to a side of the channel region.

12 Claims, 9 Drawing Sheets

PRIOR ART

PRIOR ART

NMOS    PMOS

NMOS    PMOS

METHOD FOR FABRICATING SEMICONDUCTOR DEVICE

TECHNICAL FIELD OF THE INVENTION

The present invention relates to a method for fabricating a semiconductor device having a STI (Shallow Trench Isolation) therein. And more particularly, the present invention relates to a method for fabricating a semiconductor device, in which development of a parasitic transistor is well depressed.

BACKGROUND OF THE INVENTION

An SOI (Silicon On Insulator) substrate has been used for lower power consumption in an LSI. Recently, higher density or integration of semiconductor transistors has been required for an LSI. Transistors may be isolated by LOCOS (Local Oxidation of Silicon) regions, which are formed by oxidizing selectively an SOI layer.

FIG. 1 is a cross sectional view illustrating a conventional LOCOS region of a semiconductor device. As shown in FIG. 1, an insulating layer 13 is formed on a substrate. A channel-region of an SOI layer 10 is formed on the insulating layer 13. The two adjacent channel regions are isolated by a LOCOS region 12 from each other. A gate oxide layer 15 is formed on an each channel region. A gate layer 11 is formed on the gate oxide layer 15 and on the LOCOS regions 12.

The channel region (10) has a sharply shaped ends, called bird's beak. The bird's beak generates parasitic channel regions 14, which allows an electric current flow with a voltage that is lower than the gate voltage (threshold voltage). This phenomenon is called "hump". In order to avoid or reduce such a hump phenomenon, impurities may be implanted in the parasitic channel regions 14. Usually, impurities are implanted a boundary between the LOCOS region 12 and the SOI layer 10. If the amount of impurities is not sufficient, it would be difficult to avoid or reduce a hump phenomenon efficiently.

According to the conventional method related to FIG. 1, impurities are implanted into the bird's beak of the LOCOS region 12 entirely. Impurities are implanted into the boundary between the LOCOS region 12 and the SOI layer 10 in a vertical direction. In other words, the impurities are implanted in an inclined direction, for example, forty-five degrees from the horizontal direction. In this case, it would be difficult that the LOCOS regions 12 are formed accurately in location due to a shadowing phenomenon. As a result, the conventional technology is not appropriate to a higher integration of semiconductor device, having a narrow gate width.

Another way of suppressing a hump phenomenon is described in Japanese Patent Publication Kohkai H10-93101. According to the publication, as shown in FIG. 2, an insulating layer 23 is formed on a semiconductor substrate 26. A channel region (p-type semiconductor layer) 20 is formed on the insulating layer 23. The channel region 20 is isolated from adjacent channel regions (not shown) by an isolation layer 22. A gate insulation layer 25 is formed on the channel region 20. A gate material 21 is formed on the isolation layer 22 and the gate insulation layer 25. The isolation layer 22 is formed from BSG (Boron-doped Silicate Glass) film. When a thermal treatment is carried out, p-type impurities are diffused from the isolation layer 22 into a diffusion region 24, so that a high-impurity diffusion region 24 is formed on a side surface of the channel region 20.

Since, a p-type impurities are implanted into the diffusion regions 24, a BSG film, which is a supply source of high-density impurities to the diffusion regions 24, is used as a buried oxide layer to avoid a hump phenomenon of PMOS transistor. If a hump is generated on a PMOS transistor, such a hump could not be avoided by the BSG film.

Still another conventional way to inhibit a parasitic transistor, a nitride layer, which is used as a mask when forming LOCOS regions, is selectively etched with a high-temperature phosphoric acid. By such an etching process, the nitride layer is partially removed in a horizontal direction, so that the LOCOS regions are exposed partially. After that, impurities are implanted into ends of the exposed LOCOS regions in a vertical direction of the substrate. The implanted impurities restrain generation of a parasitic transistor. However, it is difficult to control removing amount of the nitride layer, since the nitride layer is removed in a wet-etching process. As a result, it is difficult to apply the above described conventional technology to a semiconductor device having a narrow channel region and gate width.

SUMMARY OF THE INVENTION

Accordingly, an object of the present invention is to provide an improved method for fabricating a semiconductor device, in which generation of a parasitic transistor is prevented effectively.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

According to a first aspect of the present invention, a method for fabricating a semiconductor device includes: providing a semiconductor substrate; forming a STI region on the semiconductor substrate; forming a channel region on the semiconductor substrate; implanting impurities into the STI region; and performing a thermal treatment to diffuse impurities to a side of the channel region.

Preferably, a method for fabricating a semiconductor device includes: providing a semiconductor substrate; forming an insulating layer on the semiconductor substrate; forming a SOI layer on the insulating layer; patterning a nitride layer on the SOI layer; forming a trench region and a channel region on the insulating layer using the nitride layer as a mask; forming a $SiO_2$ layer over the entire structure including inside the trench region; removing the $SiO_2$ layer so that the $SiO_2$ layer, filled in the trench region, remains to form a STI region; implanting impurities into the STI region using the nitride layer as a mask; removing the nitride layer from the channel region; and performing a thermal treatment to diffuse impurities, implanted in the STI region, to a side of the channel region.

According to a second aspect of the present invention, a method for fabricating a semiconductor device, comprising: providing a semiconductor substrate; forming a STI region on the semiconductor substrate; forming a first channel region for a PMOS transistor and a second channel region for a NMOS transistor on the semiconductor substrate; masking a region for one of the PMOS and NMOS transistors; implanting first impurities into the STI region; masking a region for the other of the PMOS and NMOS transistors; implanting second impurities into the STI region; and performing a thermal treatment to diffuse impurities to sides of the channel regions of the PMOS and NMOS transistors.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1:
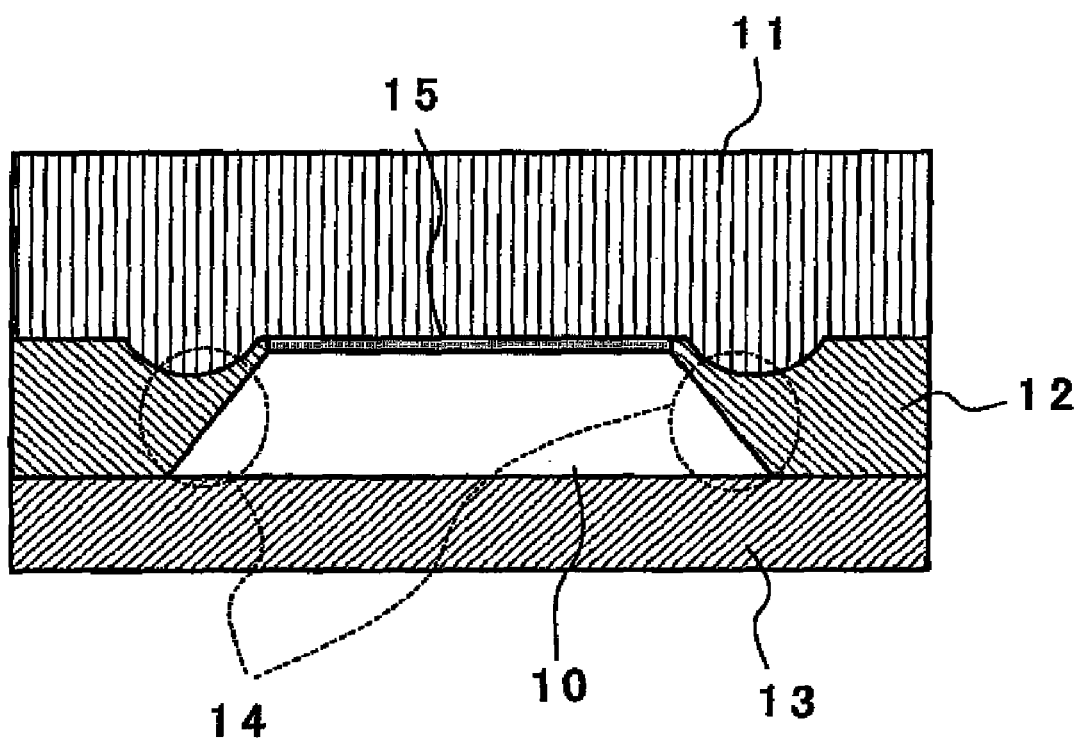
FIG. 1 is a cross sectional view illustrating a conventional LOCOS region of a semiconductor device.
Figure 2:
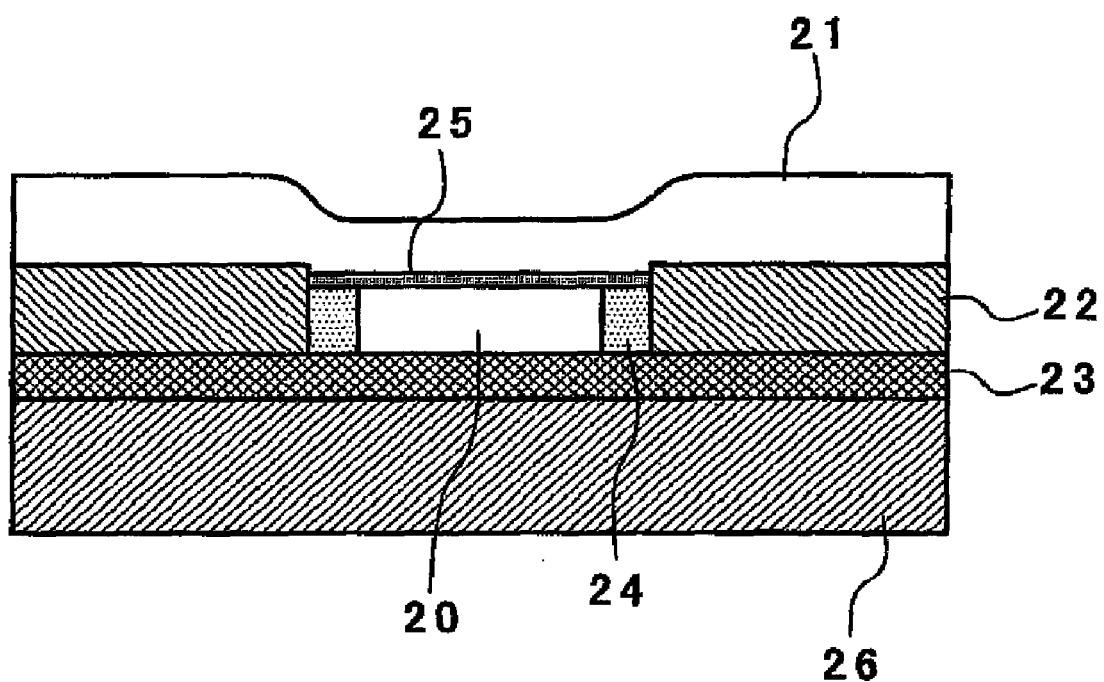
FIG. 2 is a cross sectional view illustrating a conventional semiconductor element.
Figure 3A:
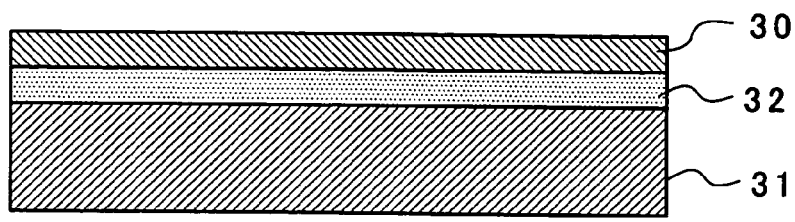
FIGS. 3A-3G are cross-sectional views illustrating fabrication steps of a semiconductor device according to a first preferred embodiment of the present invention.
Figure 3B:
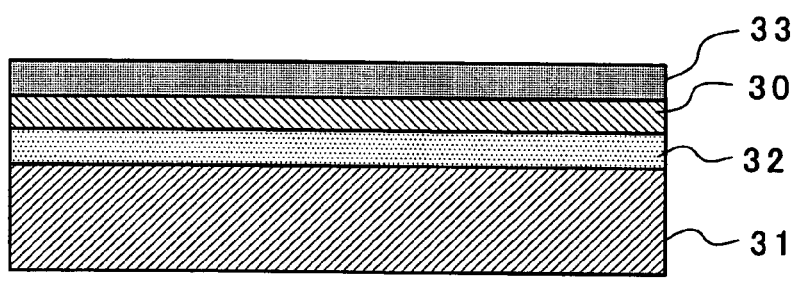
Figure 3C:
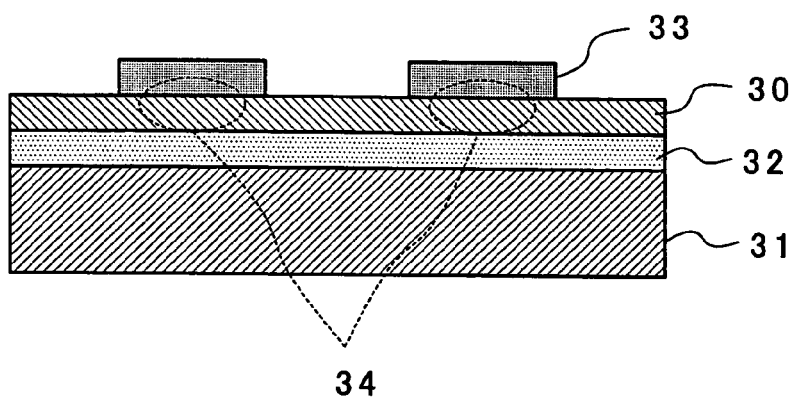

FIGS. 3A-3G are cross-sectional views illustrating fabrication steps of a semiconductor device according to a first preferred embodiment of the present invention. A $SiO_2$ layer 32 is formed on a silicon substrate 31. A SOI layer 30 is formed on the $SiO_2$ layer 32, as shown in FIG. 3A. Next, as shown in FIG. 3B, a nitride layer 33 is formed on the SOI layer 30. After that, as shown in FIG. 3C, the nitride layer 33 is patterned to remain regions for channel regions 34. The patterned nitride layer 33 is functioning as a mask until channel-stop ions are implanted.

Figure 3D:
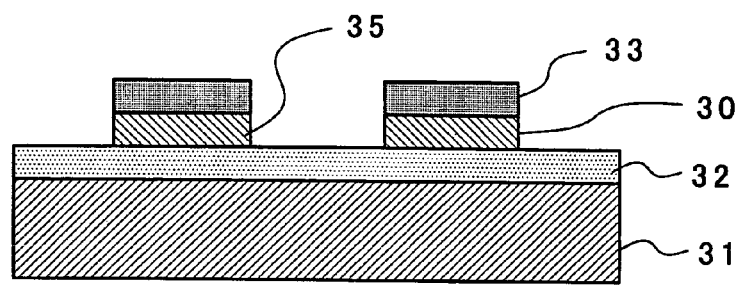
Figure 3E:
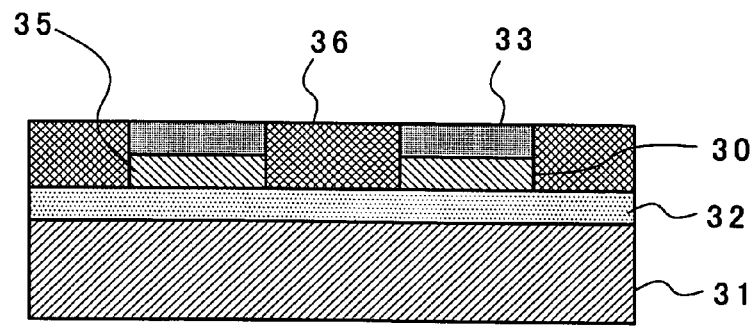

According to the first preferred embodiment, STI technology is used for isolating adjacent semiconductor elements. The SOI layer 30 is etched using the nitride layer 33 as a mask to form trenches 35, as shown in FIG. 3D. Next, a field oxide layer 36 is formed in the trenches 35 by a CVD process. The field oxide layer 36 may be of $SiO_2$. After that, the field oxide layer 36 is polished by a CMP process, as shown in FIG. 3E. The CMP process is carried out until the nitride layer 33 is exposed so that an upper surface of the nitride layer 33 and an upper surface of the field oxide layer 36 are shaped to be the same level and flat.

Figure 3F:
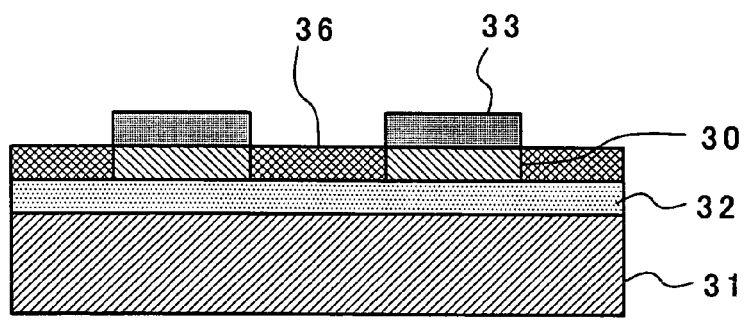

Next, as shown in FIG. 3F, the field oxide layer 36 is selectively etched at an appropriate etching rate so that the SOI layer 30 and the field oxide layer 36 have substantially identical thickness. A difference in height or thickness between the SOI layer 30 and the field oxide layer 36 is removed to prevent or reduce a generation of a parasitic transistor.

Figure 3G:
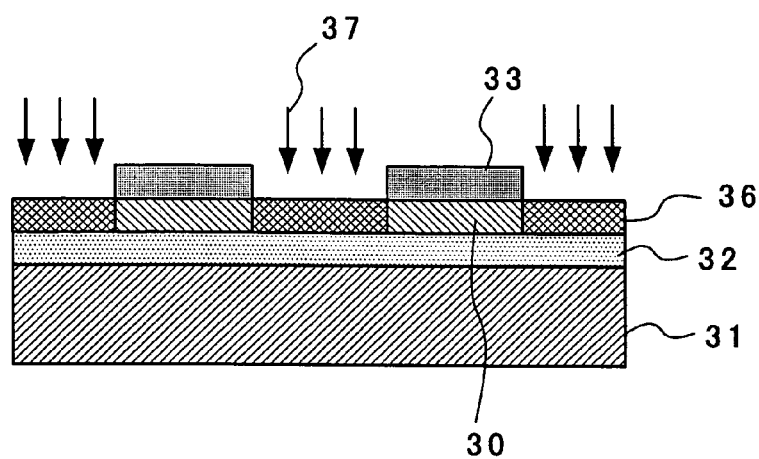

Next, as shown in FIG. 3G, channel stop ions 37 are implanted into the wafer in a vertical direction. For example, $BF_2^+$ ions are implanted into the field oxide layer having a thickness of 400 Å at a power of 30 keV using the nitride layer 33 as a mask. An impurity concentration of $BF_2^+$ is 1.0E13-1.0E14 (ions/cm$^2$). Such an ion implanting process is carried out according to a self-alignment of the nitride layer 33. After the ion implanting process of the impurities 37, the nitride layer 33 is removed. The above described fabrication steps are for NMOS transistor. If a PMOS transistor is fabricated, impurities of $P^+$ ions or arsenic ions ($As^+$) would be implanted instead of $BF_2^+$.

After that, well know processes, including a thermal treatment, are carried out to complete a transistor. A thermal treatment may be carried out by 800° C. to 1000° C. to diffuse the impurities 37 to ends of the channel region. An impurity concentration at the end or side portions of the channel region is increased, so that generation of a parasitic transistor at the end portions of the channel (active) region.

Figure 4:
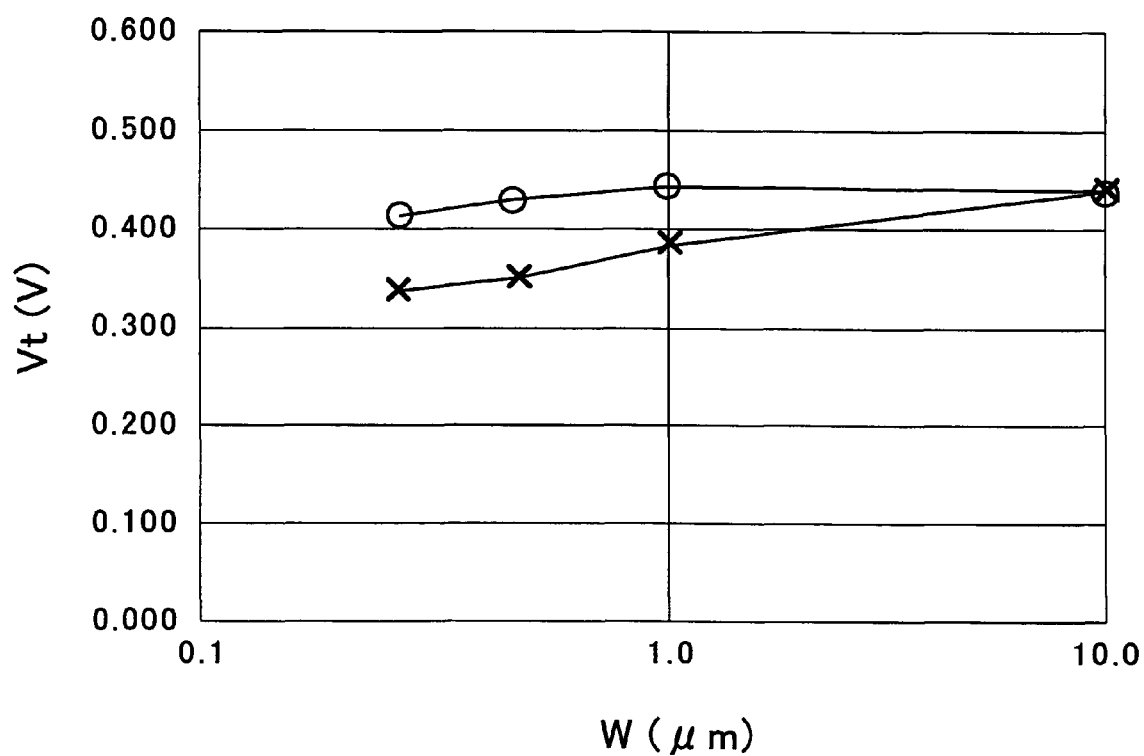
FIG. 4 is a graph showing an effect and advantage of the first preferred embodiment of the present invention.

FIG. 4 is a graph showing an effect and advantage of the first preferred embodiment of the present invention. The graph shows variation of threshold voltage of a transistor, using STI technology, relative to a gate width. In the graph, the gate width W is indicated by LOG (logarithm) scale. In the graph, a line connecting "X" plots indicates data according to a conventional transistor, a channel stop ion is not implanted. On the other hand, a line connecting "O" plots indicates data according to the first preferred embodiment.

In general, when a width of gate of a transistor is decreased, a threshold voltage of the transistor would be decreased. As a result, a drain current would be flowing at a voltage lower than the threshold voltage, which may be called "hump" phenomenon. According to the present invention, a threshold voltage of a transistor is not lowered even if a gate width is decreased. A high impurity concentration at end portions of an active region prevents a lower of a threshold voltage of a transistor. On the other hand, according to the conventional transistor, a larger parasitic transistor is generated, so that a threshold voltage of a transistor is lowered.

FIGS. 5A-5H are cross-sectional views illustrating fabrication steps of a semiconductor device according to a second preferred embodiment of the present invention. The second preferred embodiment describes fabrication steps of a CMOS transistor. In FIGS. 5A-5H, the same or corresponding components to those shown in FIGS. 3A-3G are represented by the same reference numerals.

Figure 5A:
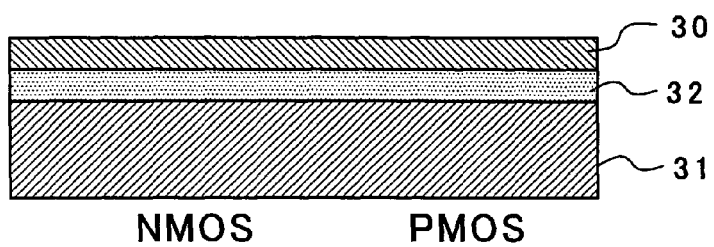
FIGS. 5A-5H are cross-sectional views illustrating fabrication steps of a semiconductor device according to a second preferred embodiment of the present invention.
Figure 5B:
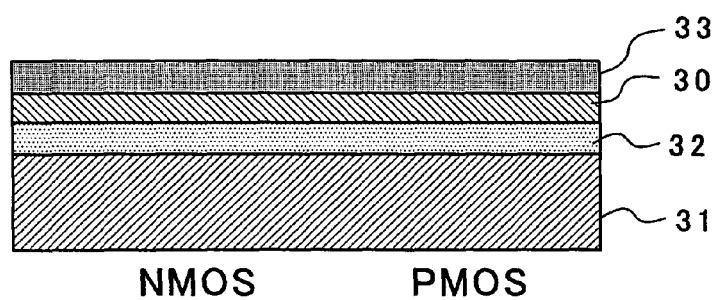
Figure 5C:
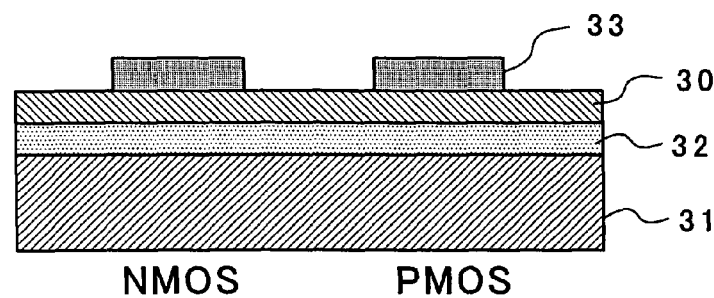

A $SiO_2$ layer 32 is formed on a silicon substrate 31. A SOI layer 30 is formed on the $SiO_2$ layer 32, as shown in FIG. 5A. Next, as shown in FIG. 5B, a nitride layer 33 is formed on the SOI layer 30. After that, as shown in FIG. 5C, the nitride layer 33 is patterned to remain regions for channel regions 34. The patterned nitride layer 33 is functioning as a mask until a channel-stop ion is implanted.

Figure 5D:
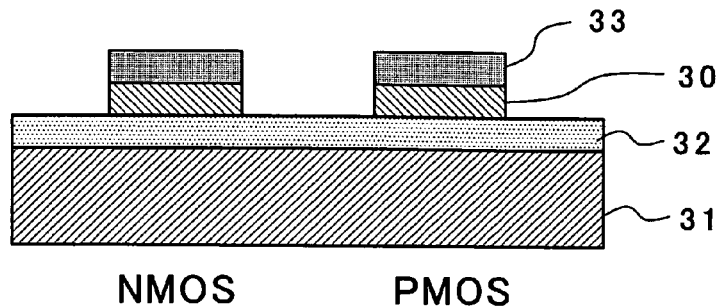
Figure 5E:
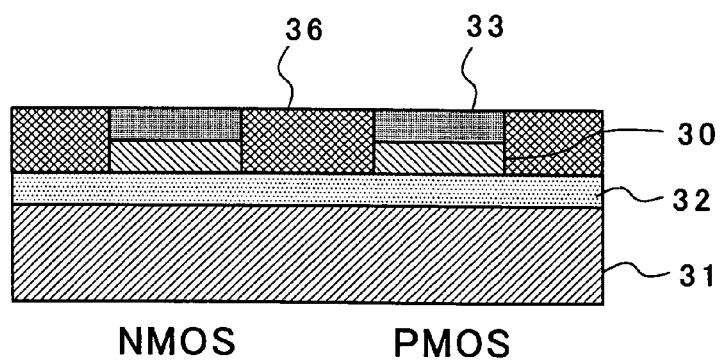

According to the second preferred embodiment, STI technology is used for isolating adjacent semiconductor elements. The SOI layer 30 is etched using the nitride layer 33 as a mask to form trenches, as shown in FIG. 5D. Next, a field oxide layer 36 is formed in the trenches by a CVD process. The field oxide layer 36 may be of $SiO_2$. After that, the field oxide layer 36 is polished by a CMP process, as shown in FIG. 5E. The CMP process is carried out until the nitride layer 33 is exposed so that an upper surface of the nitride layer 33 and an upper surface of the field oxide layer 36 are shaped to be the same level and flat.

Figure 5F:
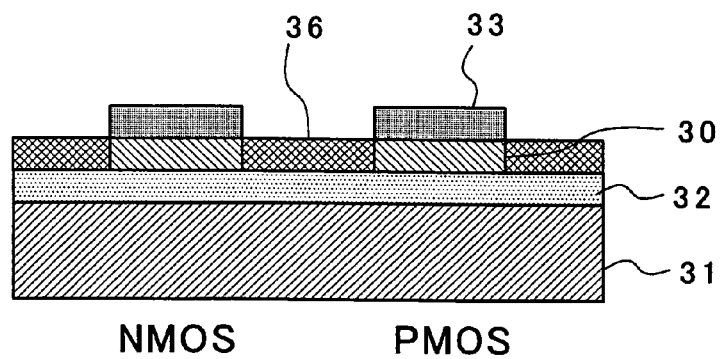

Next, as shown in FIG. 5F, the field oxide layer 36 is selectively etched at an appropriate etching rate so that the SOI layer 30 and the field oxide layer 36 have substantially identical thickness. A difference in height or thickness between the SOI layer 30 and the field oxide layer 36 is removed to prevent or reduce a generation of a parasitic transistor.

Figure 5G:
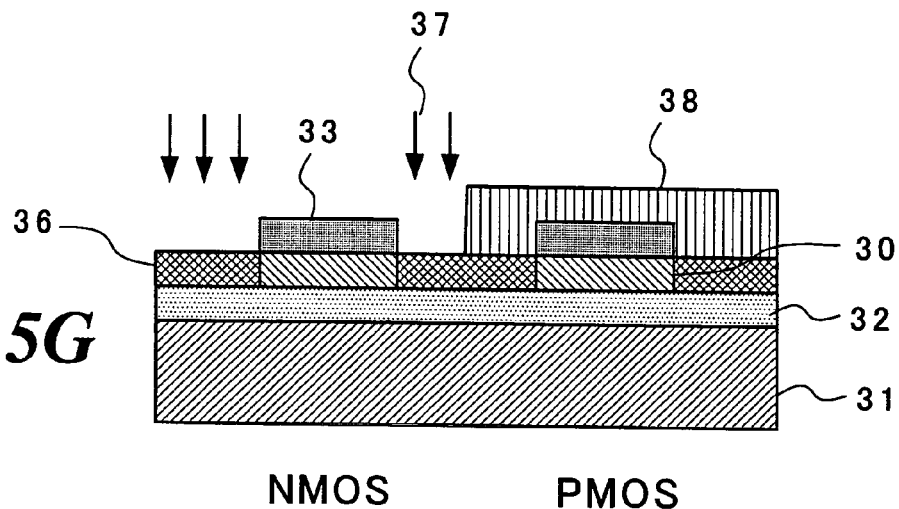

Next, as shown in FIG. 5G, a mask layer 38 is formed over a region for PMOS transistor, and then, channel stop ions 37 are implanted into the wafer in a vertical direction. For example, $BF_2^+$ ions are implanted into the field oxide layer 36 having a thickness of 400 Å at a power of 30 keV using the mask layer 38 and the nitride layer 33 as a mask. An impurity concentration of $BF_2^+$ is 1.0E14 (ions/cm$^2$). Such an ion implanting process is carried out according to a self-alignment of the nitride layer 33.

Figure 5H:
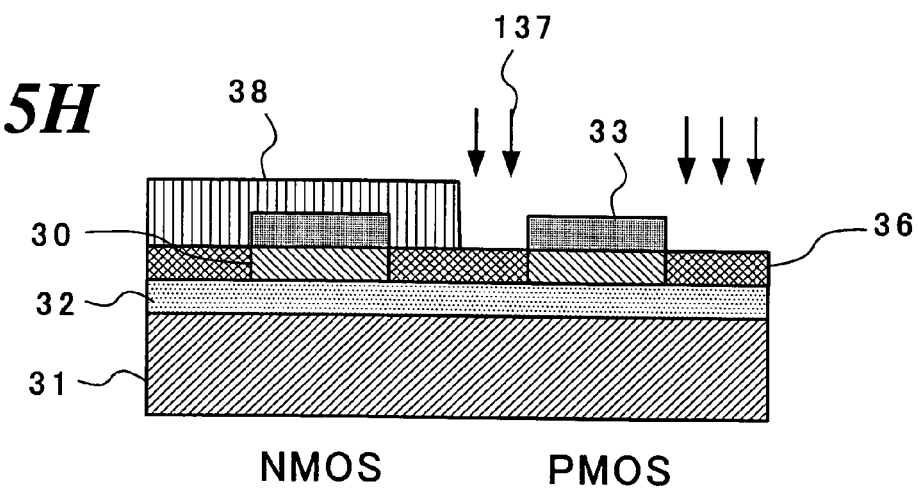

Next, as shown in FIG. 5H, a mask layer 38 is formed over a region for NMOS transistor, and then, channel stop ions 137 are implanted into the wafer in a vertical direction. For example, $P^+$ ions or $As^+$ ions are implanted into the field oxide layer having a thickness of 400 Å at a power of 30 keV using the mask layer 38 and the nitride layer 33 as a mask. An impurity concentration of $P^+$ is 1.0E14 (ions/cm$^2$). Such an ion implanting process is carried out according to a self-alignment of the nitride layer 33. After the ion implanting process of the impurities 37, the nitride layer 33 is removed.

After that, well know processes, including a thermal treatment, are carried out to complete a transistor. A thermal treatment may be carried out by 800° C. to 1000° C. to diffuse the impurities 37 to ends of the channel regions. An impurity concentration at the end or side portions of the channel regions is increased, so that generation of a parasitic transistor at the end portions of the channel (active) regions.

According to the second preferred embodiment, threshold voltages of PMOS and NMOS transistors are not lowered even if gate widths are decreased. A high impurity concentration at end portions of active regions prevents a lower of threshold voltages of the transistors.

What is claimed is:

1. A method for fabricating a semiconductor device, comprising:
   providing a semiconductor substrate;
   forming an insulating layer on the semiconductor substrate;
   forming a STI region on the insulating layer;
   forming a SOI layer on the insulating layer, the SOI layer including a channel region;
   implanting impurities into the STI region; and
   performing a thermal treatment to diffuse the impurities implanted within the STI region to a side of the channel region.

2. A method for fabricating a semiconductor device according to claim 1, wherein the semiconductor device is a NMOS transistor, and the impurities are boron fluoride ($BF_2$).

3. A method for fabricating a semiconductor device according to claim 1, wherein the semiconductor device is a PMOS transistor, and the impurities are phosphorus ions ($P^+$) or arsenic ions ($As^+$).

4. A method for fabricating a semiconductor device according to claim 1, wherein the STI region is made of $SiO_2$.

5. A method for fabricating a semiconductor device according to claim 1, wherein the impurities are implanted in a vertical direction to the STI region.

6. A method for fabricating a semiconductor device, comprising:
   providing a semiconductor substrate;
   forming an insulating layer on the semiconductor substrate;
   forming a SOI layer on the insulating layer;
   patterning a nitride layer on the SOI layer;
   forming a trench region and a channel region on the insulating layer using the nitride layer as a mask;
   forming a $SiO_2$ layer over the entire structure including inside the trench region;
   removing the $SiO_2$ layer so that the $SiO_2$ layer, filled in the trench region, remains to form a STI region;
   implanting impurities into the STI region using the nitride layer as a mask;
   removing the nitride layer from the channel region; and
   performing a thermal treatment to diffuse impurities, implanted in the STI region, to a side of the channel region.

7. A method for fabricating a semiconductor device according to claim 6, wherein the semiconductor device is a NMOS transistor, and the impurities are boron fluoride ($BF_2$).

8. A method for fabricating a semiconductor device according to claim 6, wherein the semiconductor device is a PMOS transistor, and the impurities are phosphorus ions ($P^+$) or arsenic ions ($As^+$).

9. A method for fabricating a semiconductor device, comprising:
   providing a semiconductor substrate;
   forming an insulating layer on the semiconductor substrate;
   forming a SOI layer on the insulating layer;
   forming first and second STI regions on the insulating layer;
   forming a first channel region for a PMOS transistor and a second channel region for a NMOS transistor on the insulating layer;
   masking a region of one of the PMOS and NMOS transistors;
   implanting first impurities into the first STI region;
   masking a region of an other of the PMOS and NMOS transistors;
   implanting second impurities into the second STI region; and
   performing a thermal treatment to diffuse the first and second impurities implanted into the first and second STI regions to sides of the channel regions of the PMOS and NMOS transistors.

10. A method for fabricating a semiconductor device according to claim 9, wherein the first and second impurities are boron fluoride ($BF_2$) and phosphorus ($P^+$) or arsenic ($As^+$), the boron fluoride ($BF_2$) ions being implanted in the NMOS region and phosphorus or arsenic ($As^+$) ions being implanted in the PMOS region.

11. A method for fabricating a semiconductor device according to claim 9, wherein the STI regions are made of $SiO_2$.

12. A method for fabricating a semiconductor device according to claim 9, wherein the first and second impurities are implanted in a vertical direction to the STI regions.

* * * * *